(12) United States Patent  
Camacho et al.

(10) Patent No.: US 8,334,584 B2
(45) Date of Patent: Dec. 18, 2012

(54) INTEGRATED CIRCUIT PACKAGING SYSTEM WITH QUAD FLAT NO-LEAD PACKAGE AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 431 days.

(21) Appl. No.: 12/562,874

(22) Filed: Sep. 18, 2009

(65) Prior Publication Data

US 2011/0068463 A1    Mar. 24, 2011

(51) Int. Cl.
*H01L 23/495* (2006.01)
*H01L 21/44* (2006.01)

(52) U.S. Cl. . 257/676; 257/686; 257/787; 257/E23.037; 257/E21.502; 257/784

(58) Field of Classification Search ............. 257/686, 257/784, 787, 676, E23.037, E21.052; 438/112, 438/124, 127
See application file for complete search history.

(56) References Cited

U.S. PATENT DOCUMENTS

| | | | |
|---|---|---|---|
| 5,976,912 A * | 11/1999 | Fukutomi et al. | 438/110 |
| 6,001,671 A * | 12/1999 | Fjelstad | 438/112 |
| 6,376,921 B1 * | 4/2002 | Yoneda et al. | 257/787 |
| 6,933,594 B2 * | 8/2005 | McLellan et al. | 257/676 |
| 7,049,177 B1 | 5/2006 | Fan et al. | |
| 7,087,462 B1 * | 8/2006 | Park et al. | 438/112 |
| 7,208,826 B2 * | 4/2007 | Sakamoto et al. | 257/687 |
| 7,691,674 B1 * | 4/2010 | Bathan et al. | 438/109 |
| 7,952,198 B2 * | 5/2011 | Lin | 257/738 |
| 8,133,759 B2 * | 3/2012 | Lee et al. | 438/106 |
| 2004/0097017 A1 * | 5/2004 | Shimanuki | 438/124 |
| 2006/0197207 A1 * | 9/2006 | Chow et al. | 257/686 |
| 2007/0001275 A1 * | 1/2007 | Shirasaka et al. | 257/666 |
| 2007/0059863 A1 | 3/2007 | Li et al. | |
| 2007/0093000 A1 * | 4/2007 | Shim et al. | 438/123 |
| 2007/0145580 A1 * | 6/2007 | Satou et al. | 257/723 |
| 2007/0181983 A1 | 8/2007 | Takai et al. | |
| 2007/0200207 A1 | 8/2007 | Ramos et al. | |
| 2009/0001563 A1 | 1/2009 | Bathan et al. | |
| 2009/0004775 A1 | 1/2009 | Wang et al. | |
| 2009/0127680 A1 | 5/2009 | Do et al. | |

OTHER PUBLICATIONS

U.S. Appl. No. 12/235,144, filed Sep. 22, 2008, Camacho et al.
U.S. Appl. No. 12/236,437, filed Sep. 23, 2008, Merilo et al.

* cited by examiner

*Primary Examiner* — Nitin Parekh
(74) *Attorney, Agent, or Firm* — Ishimaru & Associates LLP; Mikio Ishimaru

(57) ABSTRACT

A method of manufacture of an integrated circuit packaging system includes: providing a base array having terminals and an open region; attaching a coverlay layer directly on the base array; placing a component in the open region and directly on the coverlay layer; forming an encapsulation over the base array and the component; removing the coverlay layer to leave a plane of the terminals and a plane of the component partially exposed and substantially coplanar; and removing a portion of the base array between the terminals, the terminals electrically isolated.

20 Claims, 6 Drawing Sheets

INTEGRATED CIRCUIT PACKAGING SYSTEM WITH QUAD FLAT NO-LEAD PACKAGE AND METHOD OF MANUFACTURE THEREOF

TECHNICAL FIELD

The present invention relates generally to an integrated circuit packaging system, and more particularly to a system for an integrated circuit packaging system with quad flat no-lead package.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base array having terminals and an open region; attaching a coverlay layer directly on the base array; placing a component in the open region and directly on the coverlay layer; forming an encapsulation over the base array and the component; removing the coverlay layer to leave a plane of the terminals and a plane of the component partially exposed and substantially coplanar; and removing a portion of the base array between the terminals, the terminals electrically isolated.

The present invention provides an integrated circuit packaging system, including: a base array having terminals and an open region; a component in the open region, a plane of the terminals and a plane of the component partially exposed and substantially coplanar having characteristics of a coverlay layer removed; and an encapsulation over the base array and the component, the terminals electrically isolated and a portion of the base array removed between the terminals having characteristics of a removal process.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
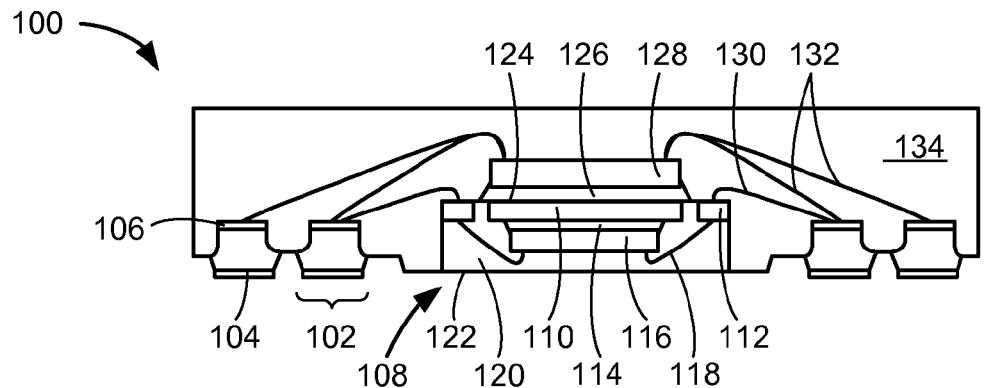
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact among elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 2:
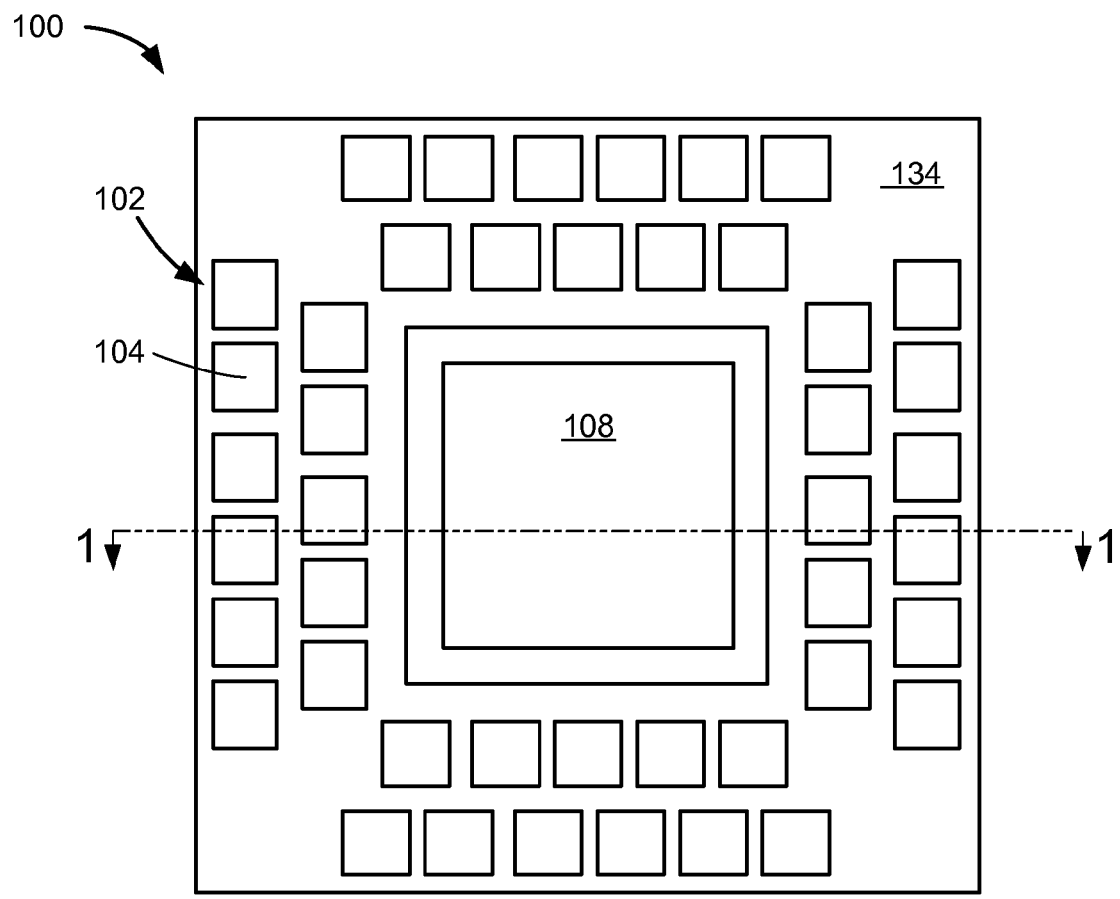
FIG. 2 is a bottom view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can include a package, a multi-row quad flat no-lead (QFN-mr) package, a package-in-package QFN-mr package, a saw singulated QFN-mr (QFNs-mr) package, or a tapeless quad flat no-lead (QFN) package.

The integrated circuit packaging system 100 can include a terminal 102, such as a terminal lead or a peripheral lead of a leadframe, a copper leadframe, or a copper sheet that is etched, stamped, cut, or a combination thereof. The terminal 102 can include an external plated layer 104, such as a layer formed by a backside selective pre-plated leadframe (PPF) plating process, formed at the bottom of the terminal 102 for providing an electrical connection to external systems. The external plated layer 104 can be formed with nickel (Ni), palladium (Pd), gold (Au), or any other conductive material.

The terminal 102 can include an internal plated layer 106, such as a wirebonding surface plating layer or a layer formed by a PPF or silver (Ag) plating process, formed on the top of the terminal 102 for attaching an electrical interconnect thereon. The internal plated layer 106 can be formed with nickel (Ni), palladium (Pd), gold (Au), silver (Ag), or any other conductive material.

The terminal 102 can be formed in an array with multiple rows along the perimeter of the integrated circuit packaging system 100. The terminal 102 can be formed in multiple staggered rows.

The integrated circuit packaging system 100 can include a component 108, such as a package, a QFN package, a ball grid array (BGA) package, a QFN-mr package, a QFNs-mr package, a wafer level chip scale package (WLCSP), or any other package. The component 108 can include an inner semiconductor package or a known-good unit (KGU) that is fully assembled, packaged, and tested before being integrated in the integrated circuit packaging system 100.

The component 108 can be placed adjacent the terminal 102. The component 108 can be placed in the center of the integrated circuit packaging system 100. The integrated circuit packaging system 100 can include a pick and place process for placing the component 108.

The component 108 can include a paddle 110, such as a die attach paddle or a die attach pad. The component 108 can include a pad 112, such as a lead, a contact pad, or a bond pad, formed adjacent the paddle 110. The component 108 can include an inner attach layer 114, such as an adhesive, an epoxy, or a die attach material, and a device 116, such as an integrated circuit (IC) or a die, attached to the paddle 110 by the inner attach layer 114. The component 108 can include an inner interconnect 118, such as a bond wire or a conductive wire, connected to the pad 112 and the device 116.

The component 108 can include a component encapsulation 120, such as a cover including an epoxy molding compound, an encapsulation material, or a molding material, formed or molded to cover the paddle 110, the pad 112, the device 116, and the inner interconnect 118. The component 108 can include a first surface 122 and a second surface 124 opposing and over the first surface 122.

The component 108 can include the paddle 110 and the pad 112 partially exposed from the component encapsulation 120 at the second surface 124. A plane of the component 108 and a plane of the terminal 102 can be partially exposed and substantially coplanar.

The integrated circuit packaging system 100 can include a stack attach layer 126, such as an adhesive, an epoxy, or a die attach material, attached on the component 108. The integrated circuit packaging system 100 can include a stack component 128, such as an IC, a die, or a package, mounted over or attached to the second surface 124 of the component 108 by the stack attach layer 126.

The integrated circuit packaging system 100 can include a first interconnect 130, such as an interconnect wire, an electrical interconnect, a bond wire, or a conductive wire. The first interconnect 130 can be connected to the internal plated layer 106 of the terminal 102 and the pad 112 of the component 108. For illustrative purposes, the first interconnect 130 is shown connected to the terminal 102 and the component 108, although the first interconnect 130 can be connected to the component 108 and the stack component 128.

The integrated circuit packaging system 100 can include a second interconnect 132, such as an interconnect wire, an electrical interconnect, a bond wire, or a conductive wire. The second interconnect 132 can be connected to the internal plated layer 106 of the terminal 102 and the stack component 128. The integrated circuit packaging system 100 can include another of the second interconnect 132 connected to the internal plated layer 106 of another of the terminal 102 and the stack component 128.

The integrated circuit packaging system 100 can include an encapsulation 134, such as a cover including an epoxy molding compound, an encapsulation material, or a molding material. The encapsulation 134 can be formed or molded to cover a portion of the terminal 102. The encapsulation 134 can be formed or molded to cover the component 108, the stack component 128, the first interconnect 130, and the second interconnect 132.

The encapsulation 134 can cover the internal plated layer 106. The encapsulation 134 can expose a portion of the terminal 102 including the external plated layer 104. The encapsulation 134 can include a planar surface substantially coplanar with the first surface 122 of the component 108.

It has been discovered that the present invention can provide a known good unit (KGU) solution for integrating devices, such as the component 108 and the stack component 128. The present invention can include the component 108, such as an inner semiconductor package or a KGU that is fully assembled, packaged, and tested before being integrated in the integrated circuit packaging system 100.

Referring now to FIG. 2, therein is shown a bottom view of the integrated circuit packaging system 100. The integrated circuit packaging system 100 can include the terminal 102.

The terminal 102 can include the external plated layer 104 formed on the bottom of the terminal 102 for providing an electrical connection to external systems. The terminal 102 can be formed in an array with multiple rows along the perimeter of the integrated circuit packaging system 100. The terminal 102 can be formed in multiple staggered rows.

The integrated circuit packaging system 100 can include the component 108. The component 108 can be placed adjacent the terminal 102 and in the center of the integrated circuit packaging system 100.

The integrated circuit packaging system 100 can include the encapsulation 134. The encapsulation 134 can be formed or molded to cover a portion of the terminal 102. The encapsulation 134 can be formed or molded to cover the component 108. The encapsulation 134 can expose the external plated layer 104. The encapsulation 134 can include a planar surface substantially coplanar with that of the component 108.

Figure 3:
FIG. 3 is a cross-sectional view of a portion of the integrated circuit packaging system along the section line 1-1 of FIG. 2 in an assembly process of a providing phase of a base array.

Referring now to FIG. 3, therein is shown a cross-sectional view of a portion of the integrated circuit packaging system 100 along the section line 1-1 of FIG. 2 in an assembly process of a providing phase of a base array 302. The base array 302 can include an array of terminal leads of a leadframe or a sheet that is etched, stamped, cut, or a combination thereof. The leadframe or the sheet can include copper.

The base array 302 can be formed adjacent an open region 304, such as a cavity, a central window cavity, a central hole, or a central cavity. The open region 304 can be formed adjacent the terminal 102. The open region 304 can be a region without the terminal 102. The open region 304 can be surrounded by the base array 302. The base array 302 can include an etched area 306 that is half or partially etched and adjacent the terminal 102.

The terminal 102 can include the external plated layer 104 formed by a backside selective pre-plated leadframe (PPF) plating process. The external plated layer 104 can be formed at the bottom of the terminal 102 for providing an electrical connection to external systems.

The external plated layer 104 can be formed with nickel (Ni), palladium (Pd), gold (Au), or any other conductive material. The base array 302 can include an unplated area 308, where the base array 302 is not pre-plated with the external plated layer 104 at a bottom surface 310 of the base array 302.

The terminal 102 can include the internal plated layer 106 formed by a PPF or silver (Ag) plating process. The internal plated layer 106 can be formed on the top of the terminal 102 for attaching an electrical interconnect thereon.

The internal plated layer 106 can be formed with nickel (Ni), palladium (Pd), gold (Au), silver (Ag), or any other conductive material. The terminal 102 can be formed in an array with multiple rows along the perimeter of the integrated circuit packaging system 100. The terminal 102 can be formed in multiple staggered rows.

Figure 4:
FIG. 4 is a cross-sectional view of the structure of FIG. 3 in an attachment phase of a coverlay layer.

Referring now to FIG. 4, therein is shown a cross-sectional view of the structure of FIG. 3 in an attachment phase of a coverlay layer 402. The integrated circuit packaging system 100 can include the coverlay layer 402, such as a coverlay tape or a backside coverlay tape.

The coverlay layer 402 can include a non-sticky side 404 and a sticky side 406, such as a tacky side, opposing the non-sticky side 404. The base array 302 can be attached on or directly to the sticky side 406.

Figure 5:
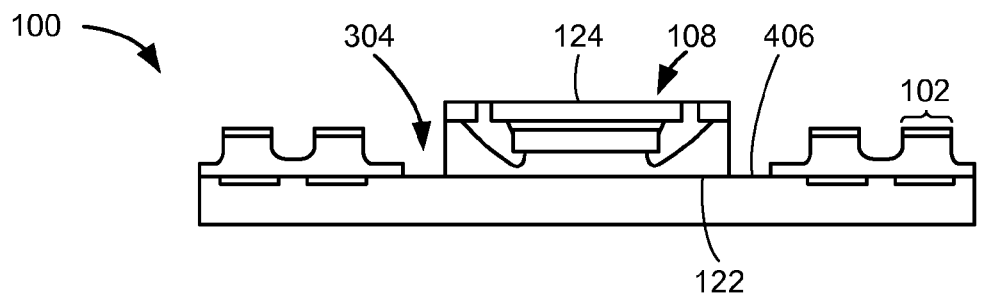
FIG. 5 is a cross-sectional view of the structure of FIG. 4 in a placement phase of the component.

Referring now to FIG. 5, therein is shown a cross-sectional view of the structure of FIG. 4 in a placement phase of the component 108. The component 108 can include the first surface 122 and the second surface 124 opposing and over the first surface 122. The first surface 122 can be placed or attached on the sticky side 406.

The component 108 can be placed adjacent the terminal 102. The component 108 can be placed in the open region 304 in the center of the integrated circuit packaging system 100. The component 108 can be placed by a pick and place process or an adhesiveless pick and place process.

Figure 6:
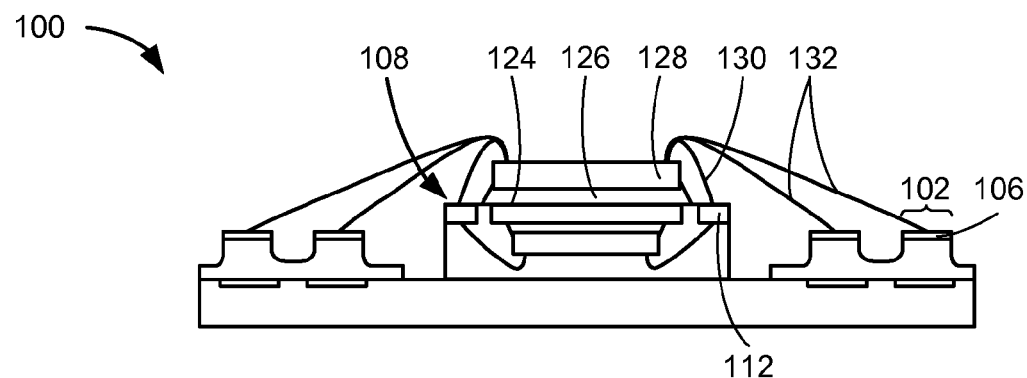
FIG. 6 is a cross-sectional view of the structure of FIG. 5 in a mounting phase of the stack component.

Referring now to FIG. 6, therein is shown a cross-sectional view of the structure of FIG. 5 in a mounting phase of the stack component 128. The integrated circuit packaging system 100 can include the stack attach layer 126 attached on the component 108. The stack component 128 can be mounted over or attached to the second surface 124 of the component 108 by the stack attach layer 126.

The integrated circuit packaging system 100 can include the first interconnect 130 connected to the pad 112 of the component 108 and the stack component 128. For illustrative purposes, the first interconnect 130 is shown connected to the pad 112 of the component 108 and the stack component 128, although the first interconnect 130 can be connected to the internal plated layer 106 of the terminal 102 and the pad 112 of the component 108.

The integrated circuit packaging system 100 can include the second interconnect 132 connected to the internal plated layer 106 of the terminal 102 and the stack component 128. The integrated circuit packaging system 100 can include another of the second interconnect 132 connected to the internal plated layer 106 of another of the terminal 102 and the stack component 128.

Figure 7:
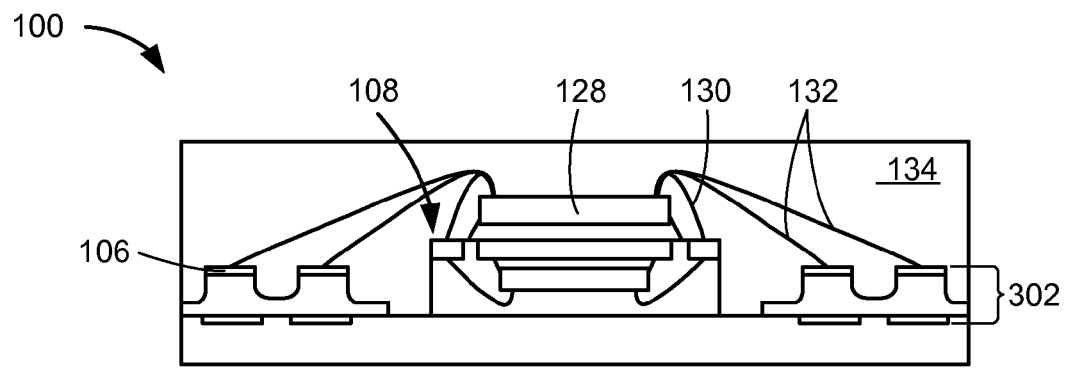
FIG. 7 is a cross-sectional view of the structure of FIG. 6 in a molding phase of the encapsulation.

Referring now to FIG. 7, therein is shown a cross-sectional view of the structure of FIG. 6 in a molding phase of the encapsulation 134. The integrated circuit packaging system 100 can include the encapsulation 134 formed or molded to cover the base array 302, the component 108, the stack component 128, the first interconnect 130, and the second interconnect 132. The encapsulation 134 can cover the internal plated layer 106.

Figure 8:
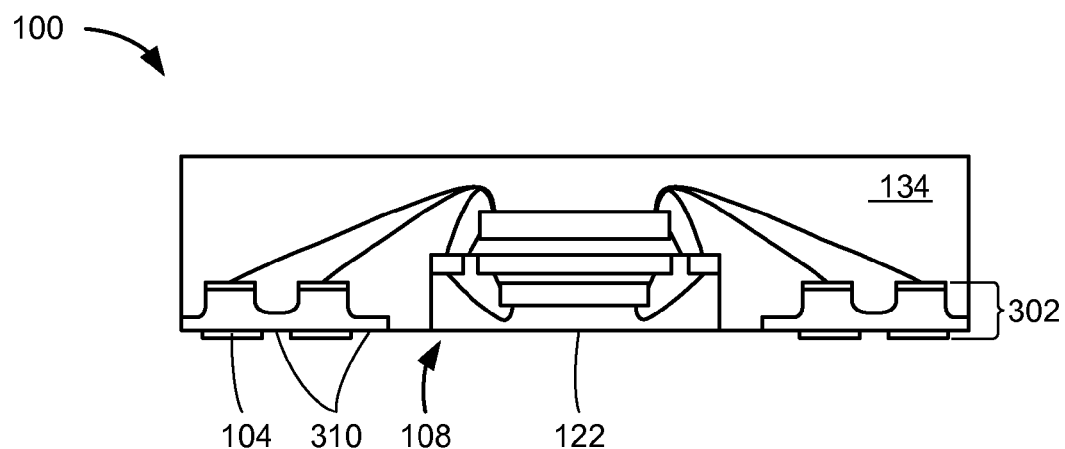
FIG. 8 is a cross-sectional view of the structure of FIG. 7 in a removal phase of the coverlay layer.

Referring now to FIG. 8, therein is shown a cross-sectional view of the structure of FIG. 7 in a removal phase of the coverlay layer 402 of FIG. 4. The coverlay layer 402 can be removed or peeled from the bottom surface 310 of the base array 302, the external plated layer 104, the bottom surface of the encapsulation 134, and the first surface 122 of the component 108.

The bottom surface 310, the first surface 122, and the bottom surface of the encapsulation 134 can form a substantially planar surface of the integrated circuit packaging system 100. The bottom surface 310, the external plated layer 104, and the first surface 122 can be exposed from the encapsulation 134.

The bottom surface 310, the external plated layer 104, and the first surface 122 of the component 108 can include characteristics of the coverlay layer 402 removed. The characteristics of the coverlay layer 402 removed can include physical features, such as adhesive or tacky residue or other marks of being attached directly to the coverlay layer 402. The plane of the component 108 and the plane of the terminal 102 can be partially exposed and substantially coplanar having characteristics of the coverlay layer 402 removed.

Figure 9:
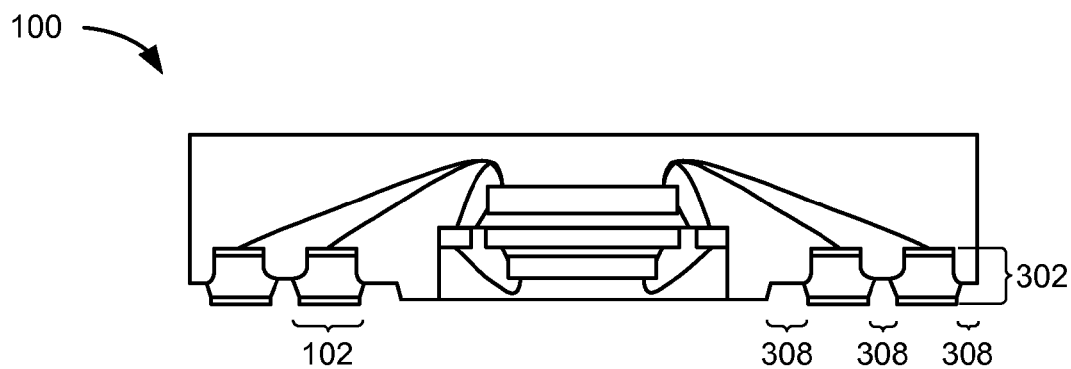
FIG. 9 is a cross-sectional view of the structure of FIG. 8 in an etching phase of the base array.

Referring now to FIG. 9, therein is shown a cross-sectional view of the structure of FIG. 8 in an etching phase of the base array 302. The unplated area 308 of the base array 302 can be removed or etched away, thereby electrically isolating the terminal 102 from another of the terminal 102 adjacent the terminal 102.

A portion, such as the unplated area 308, of the base array 302 can be removed between the terminal 102 and the another of the terminal 102. The portion of the base array 302 that is removed can include characteristics of a removal process. The characteristics of the removal process can include characteristics such as an etched surface, chemical residue, or a chemically processed surface.

The unplated area 308 can be selectively removed or etched. The integrated circuit packaging system 100 can include end of line (EOL) or back-end processes, such as marking or singulation.

It has been discovered that the present invention can provide a means for easily integrating multiple devices, such as the component 108 and the stack component 128, by using a package-in-package structure in the integrated circuit packaging system 100, such as a multi-row quad flat no-lead (QFN-mr) package. The present invention can provide a special QFN-mr leadframe design and the coverlay layer 402, whereby the component 108 can easily be placed and interconnected. The special QFN-mr leadframe design can include a design of a leadframe with the base array 302 and the open region 304.

Figure 10:
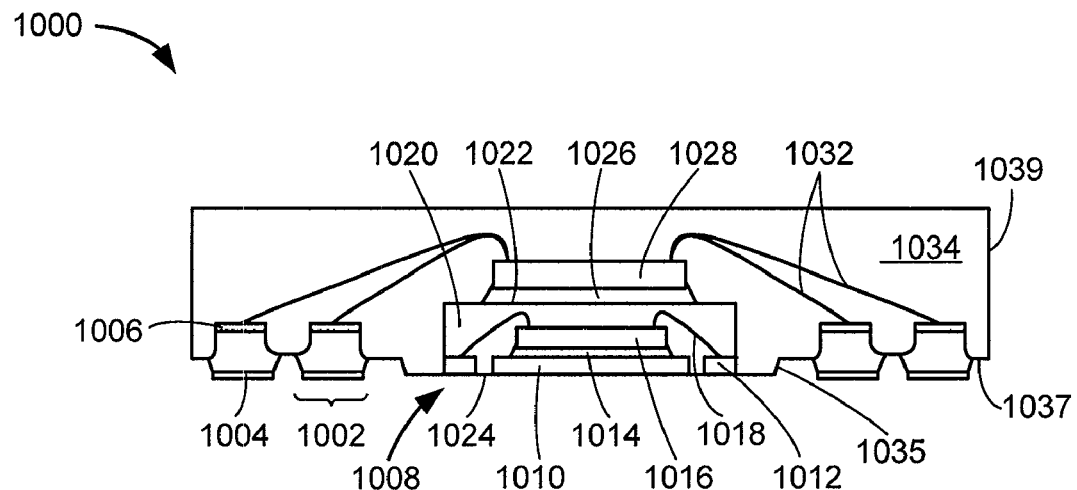
FIG. 10 is a cross-sectional view similar to FIG. 1 of an integrated circuit packaging system in a second embodiment of the present invention.

Referring now to FIG. 10, therein is shown a cross-sectional view similar to FIG. 1 of an integrated circuit packaging system 1000 in a second embodiment of the present invention. The integrated circuit packaging system 1000 can include a multi-row quad flat no-lead (QFN-mr) package, a package-in-package QFN-mr package, a saw singulated QFN-mr (QFNs-mr) package, or a tapeless quad flat no-lead (QFN) package.

The integrated circuit packaging system 1000 can include a terminal 1002, such as a terminal lead or a peripheral lead of a leadframe, a copper leadframe, or a copper sheet that is etched, stamped, cut, or a combination thereof. The terminal 1002 can include an external plated layer 1004, such as a layer formed by a backside selective pre-plated leadframe (PPF) plating process, formed at the bottom of the terminal 1002 for providing an electrical connection to external systems. The external plated layer 1004 can be formed with nickel (Ni), palladium (Pd), gold (Au), or any other conductive material.

The terminal 1002 can include an internal plated layer 1006, such as a layer formed by a PPF or silver (Ag) plating process, formed on the top of the terminal 1002 for attaching an electrical interconnect thereon. The internal plated layer 1006 can be formed with nickel (Ni), palladium (Pd), gold (Au), silver (Ag), or any other conductive material. The terminal 1002 can be formed in an array with multiple rows along the perimeter of the integrated circuit packaging system 1000.

The integrated circuit packaging system 1000 can include a component 1008, such as a package, a QFN package, a ball grid array (BGA) package, a QFN-mr package, a QFNs-mr package, a wafer level chip scale package (WLCSP), or any other package. The component 1008 can include an inner semiconductor package or a known-good unit (KGU) that is fully assembled, packaged, and tested before being integrated in the integrated circuit packaging system 1000.

The component 1008 can be placed adjacent the terminal 1002. The component 1008 can be placed in the center of the integrated circuit packaging system 1000. The integrated circuit packaging system 1000 can include a pick and place process for placing the component 1008.

The component 1008 can include a paddle 1010, such as a die attach paddle or a die attach pad. The component 1008 can include a pad 1012, such as a lead, a contact pad, or a bond pad, formed adjacent the paddle 1010. The component 1008 can include an inner attach layer 1014, such as an adhesive, an epoxy, or a die attach material, and a device 1016, such as an integrated circuit (IC) or a die, attached to the paddle 1010 by the inner attach layer 1014. The component 1008 can include an inner interconnect 1018, such as a bond wire or a conductive wire, connected to the pad 1012 and the device 1016.

The component 1008 can include a component encapsulation 1020, such as a cover including an epoxy molding compound, an encapsulation material, or a molding material, formed or molded to cover the paddle 1010, the pad 1012, the device 1016, and the inner interconnect 1018. The component 1008 can include a first surface 1022 and a second surface 1024 opposing and under the first surface 1022. The component 1008 can include the paddle 1010 and the pad 1012 partially exposed from the component encapsulation 1020 at the second surface 1024.

The integrated circuit packaging system 1000 can include a stack attach layer 1026, such as an adhesive, an epoxy, or a die attach material, attached on the component 1008. The integrated circuit packaging system 1000 can include a stack component 1028, such as an IC, a die, or a package, mounted over or attached to the first surface 1022 of the component 1008 by the stack attach layer 1026.

The integrated circuit packaging system 1000 can include an interconnect 1032, such as an interconnect wire, an electrical interconnect, a bond wire, or a conductive wire. The interconnect 1032 can be connected to the internal plated layer 1006 of the terminal 1002 and the stack component 1028. The integrated circuit packaging system 1000 can include another of the interconnect 1032 connected to the internal plated layer 1006 of another of the terminal 1002 and the stack component 1028.

The integrated circuit packaging system 1000 can include an encapsulation 1034, such as a cover including an epoxy molding compound, an encapsulation material, or a molding material. The encapsulation 1034 can be formed or molded to cover a portion of the terminal 1002. The encapsulation 1034 can be formed or molded to cover the component 1008, the stack component 1028, and the interconnect 1032. A portion of the component 1008 is exposed from the encapsulation 1034. The encapsulation 1034 includes an encapsulation step 1035 adjacent the exposed portion of the component 1008. The encapsulation 1034 includes a recessed surface 1037 extending between the encapsulation step 1035 and an outer vertical side 1039 of the encapsulation 1034.

The encapsulation 1034 can cover the internal plated layer 1006. The encapsulation 1034 can expose a portion of the terminal 1002 including the external plated layer 1004. The exposed portion of the terminal 1002 protrudes from the recessed surface 1037 of the encapsulation 1034. The encapsulation 1034 can include a planar surface substantially coplanar with the second surface 1024 of the component 1008.

The encapsulation 1034 can partially expose the paddle 1010 and the pad 1012 at the second surface 1024 of the component 1008 for providing connectivity to external systems. The component 1008 and the stack component 1028 can be interconnected at the board level.

It has been discovered that the present invention can provide an advantage of integrating the component 1008 and the stack component 1028. The advantage of such integration is that the components can be tested together based on their expected electrical functionality.

Figure 11:
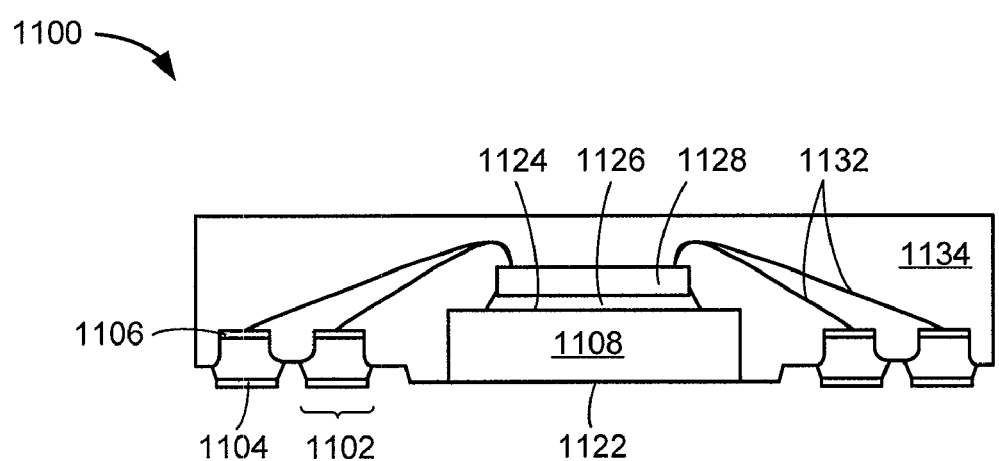
FIG. 11 is a cross-sectional view similar to FIG. 1 of an integrated circuit packaging system in a third embodiment of the present invention.

Referring now to FIG. 11, therein is shown a cross-sectional view similar to FIG. 1 of an integrated circuit packaging system 1100 in a third embodiment of the present invention. The integrated circuit packaging system 1100 can include a multi-row quad flat no-lead (QFN-mr) package, a thermally enhanced QFN-mr package, a saw singulated QFN-mr (QFNs-mr) package, or a tapeless quad flat no-lead (QFN) package.

The integrated circuit packaging system 1100 can include a terminal 1102, such as a terminal lead or a peripheral lead of a leadframe, a copper leadframe, or a copper sheet that is etched, stamped, cut, or a combination thereof. The terminal 1102 can include an external plated layer 1104, such as a layer formed by a backside selective pre-plated leadframe (PPF) plating process, formed at the bottom of the terminal 1102 for providing an electrical connection to external systems. The external plated layer 1104 can be formed with nickel (Ni), palladium (Pd), gold (Au), or any other conductive material.

The terminal 1102 can include an internal plated layer 1106, such as a layer formed by a PPF or silver (Ag) plating process, formed on the top of the terminal 1102 for attaching an electrical interconnect thereon. The internal plated layer 1106 can be formed with nickel (Ni), palladium (Pd), gold (Au), silver (Ag), or any other conductive material. The terminal 1102 can be formed in an array with multiple rows along the perimeter of the integrated circuit packaging system 1100.

The integrated circuit packaging system 1100 can include a component 1108, such as a heatsink, a metal slug, or any object that absorbs or dissipates heat from another object. The component 1108 can be placed adjacent the terminal 1102. The component 1108 can be placed in the center of the integrated circuit packaging system 1100. The component 1108 can include a first surface 1122 and a second surface 1124 opposing and over the first surface 1122.

The component 1108 can be made of a pre-fabricated metal slug. The integrated circuit packaging system 1100 can include a pick and place process for placing the component 1108 on the sticky side 406 of FIG. 4 of the coverlay layer 402 of FIG. 4.

The component 1108 can include a structure having a fin, a hollow, or a recess for increasing package thermal performance. The component 1108 can include an interlocking mechanism. The interlocking mechanism can include an interlocking edge shape to enhance interlocking with a molded body of the integrated circuit packaging system 1100.

The integrated circuit packaging system 1100 can include a stack attach layer 1126, such as a thermally conductive adhesive or gel, an adhesive, an epoxy, or a die attach material, attached on the component 1108. The integrated circuit packaging system 1100 can include a stack component 1128, such as an IC, a die, or a package, mounted over or attached to the second surface 1124 of the component 1108 by the stack attach layer 1126. The component 1108 can conduct heat away or enhance heat dissipation from the stack component 1128 to ambient during operation.

The integrated circuit packaging system 1100 can include an interconnect 1132, such as an interconnect wire, an electrical interconnect, a bond wire, or a conductive wire. The interconnect 1132 can be connected to the internal plated layer 1106 of the terminal 1102 and the stack component 1128. The integrated circuit packaging system 1100 can include another of the interconnect 1132 connected to the internal plated layer 1106 of another of the terminal 1102 and the stack component 1128.

The integrated circuit packaging system 1100 can include an encapsulation 1134, such as a cover including an epoxy molding compound, an encapsulation material, or a molding material. The encapsulation 1134 can be formed or molded to cover a portion of the terminal 1102. The encapsulation 1134 can be formed or molded to cover the component 1108, the stack component 1128, and the interconnect 1132.

The encapsulation 1134 can cover the internal plated layer 1106. The encapsulation 1134 can expose a portion of the terminal 1102 including the external plated layer 1104. The encapsulation 1134 can include a planar surface substantially coplanar with the first surface 1122 of the component 1108.

It has been discovered that the present invention can provide a thermal solution for packaging systems, which can include a QFNs-mr package that is widely gaining acceptance in the industry. The present invention can allow power applications to use a technology based on a QFNs-mr leadframe, which can include a leadframe with the base array 302 of FIG. 3. The present invention can provide such thermal solution by providing a means to easily integrating a heatsink, such as the component 1108, in a QFN-mr package, such as the integrated circuit packaging system 1100. The present invention can provide an increase in package thermal performance with the advantages of the QFN-mr (or QFNs-mr) leadframe platform in terms of lead count density and cost.

Figure 12:
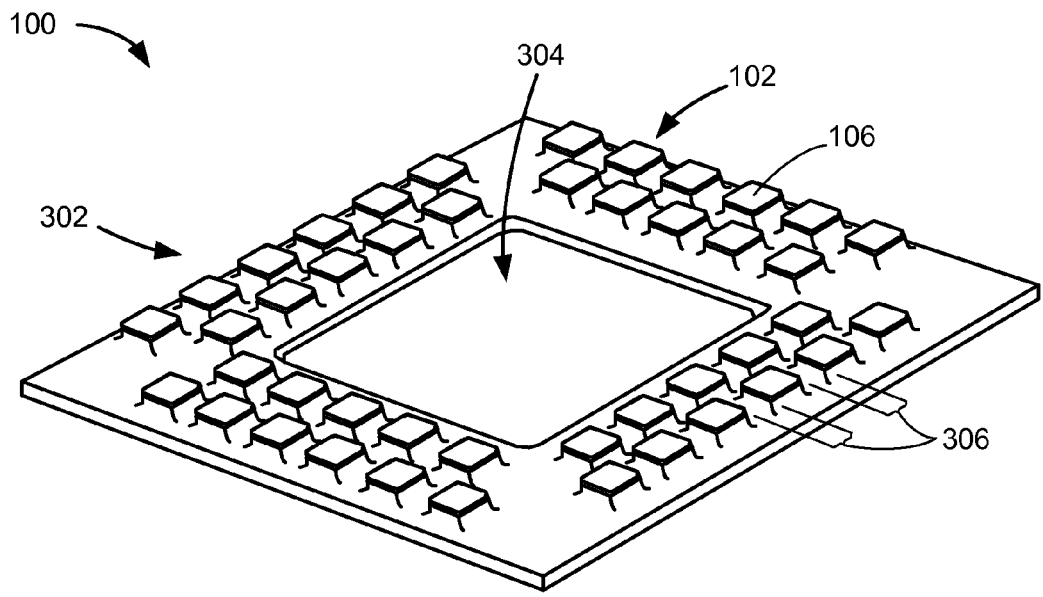
FIG. 12 is an isometric top view of the base array.

Referring now to FIG. 12, therein is shown an isometric top view of the base array 302. The base array 302 can be formed adjacent the open region 304. The open region 304 can be formed adjacent the terminal 102. The open region 304 can be surrounded by the base array 302. The base array 302 can include the etched area 306 that is half or partially etched and adjacent the terminal 102.

The terminal 102 can include the internal plated layer 106 formed by a PPF or silver (Ag) plating process. The internal plated layer 106 can be formed on the top of the terminal 102 for attaching an electrical interconnect thereon.

The internal plated layer 106 can be formed with nickel (Ni), palladium (Pd), gold (Au), silver (Ag), or any other conductive material. The terminal 102 can be formed in an array with multiple rows along the perimeter of the integrated circuit packaging system 100. The terminal 102 can be formed in multiple staggered rows.

Figure 13:
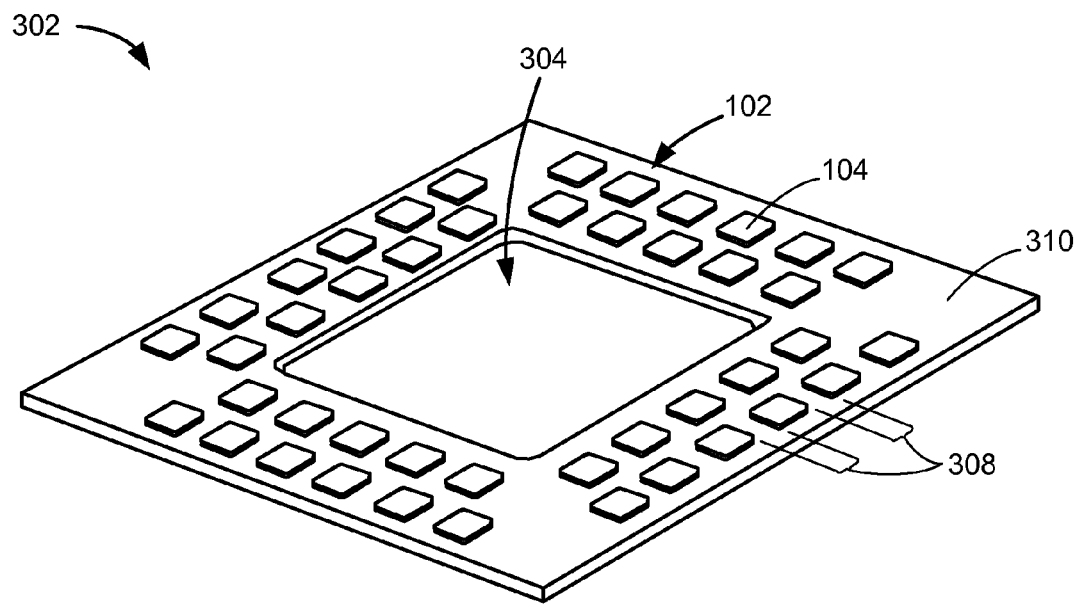
FIG. 13 is an isometric bottom view of the base array.

Referring now to FIG. 13, therein is shown an isometric bottom view of the base array 302. The base array 302 can be formed adjacent the open region 304. The open region 304 can be formed adjacent the terminal 102. The open region 304 can be surrounded by the base array 302.

The terminal 102 can include the external plated layer 104 formed by a backside selective pre-plated leadframe (PPF) plating process. The external plated layer 104 can be formed at the bottom of the terminal 102 for providing an electrical connection to external systems.

The external plated layer 104 can be formed with nickel (Ni), palladium (Pd), gold (Au), or any other conductive material. The base array 302 can include the unplated area 308, where the base array 302 is not pre-plated with the external plated layer 104 at the bottom surface 310 of the base array 302.

Figure 14:
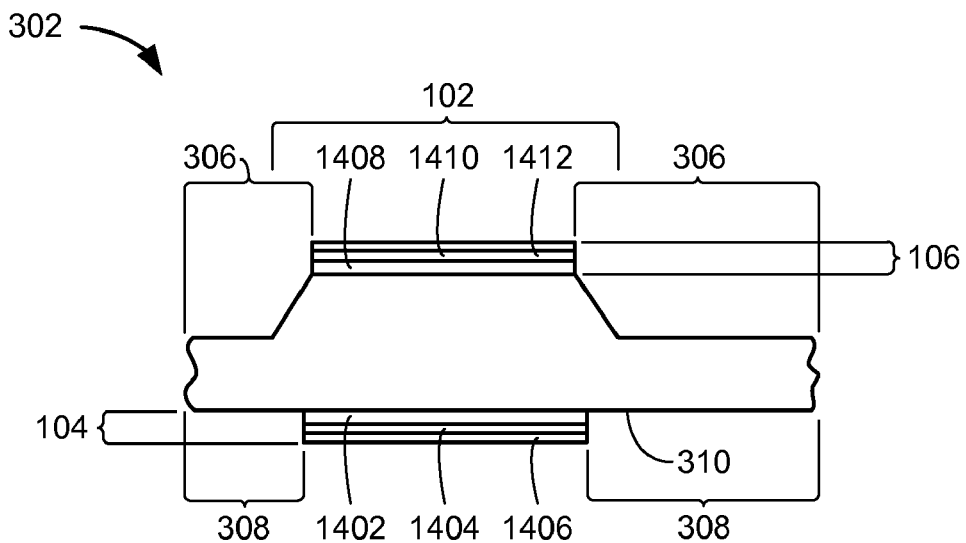
FIG. 14 is a cross-sectional view of a portion of the base array.

Referring now to FIG. 14, therein is shown a cross-sectional view of a portion of the base array 302. The base array 302 can include the etched area 306 that is half or partially etched and adjacent the terminal 102. The terminal 102 can include the external plated layer 104 and the internal plated layer 106 over the external plated layer 104. The base array 302 can include the unplated area 308, where the base array 302 is not pre-plated with the external plated layer 104 at the bottom surface 310 of the base array 302.

The external plated layer 104 can be formed with a first external plated sublayer 1402, such as a sublayer preferably formed with nickel (Ni) or any conductive material, directly attached to the bottom surface 310. The external plated layer 104 can include a second external plated sublayer 1404, such as a sublayer preferably formed with palladium (Pd) or any conductive material, directly attached to the first external plated sublayer 1402. The external plated layer 104 can include a third external plated sublayer 1406, such as a sublayer preferably formed with gold (Au) flash or any conductive material, directly attached to the second external plated sublayer 1404.

The internal plated layer 106 can be formed with a first internal plated sublayer 1408, such as a sublayer preferably formed with nickel (Ni) or any conductive material, directly attached to the top of the terminal 102. The internal plated layer 106 can include a second internal plated sublayer 1410, such as a sublayer preferably formed with palladium (Pd) or any conductive material, directly attached to the first internal plated sublayer 1408. The internal plated layer 106 can include a third internal plated sublayer 1412, such as a sublayer preferably formed with gold (Au) flash or any conductive material, directly attached to the second internal plated sublayer 1410. For illustrative purposes, the internal plated layer 106 is shown with three sublayers, although the internal plated layer 106 can be formed with a single layer of silver (Ag) or any conductive material.

Figure 15:
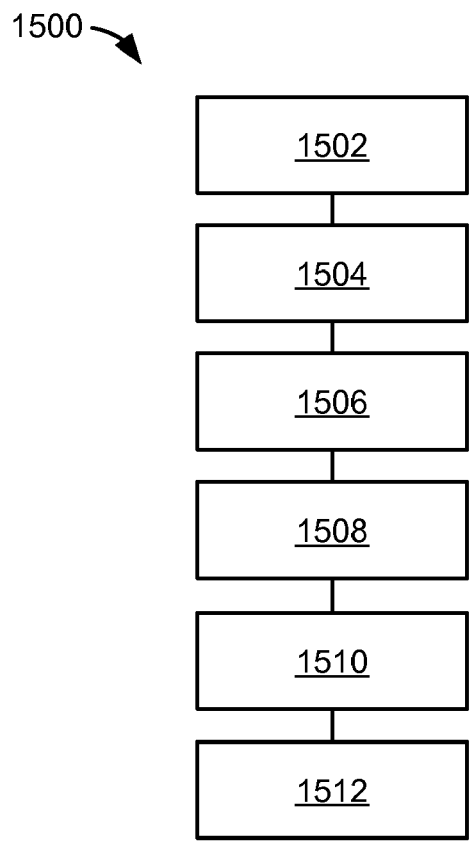
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes: providing a base array having terminals and an open region in a block 1502; attaching a coverlay layer directly on the base array in a block 1504; placing a component in the open region and directly on the coverlay layer in a block 1506; forming an encapsulation over the base array and the component in a block 1508; removing the coverlay layer to leave a plane of the terminals and a plane of the component partially exposed and substantially coplanar in a block 1510; and removing a portion of the base array between the terminals, the terminals electrically isolated in a block 1512.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a base array having terminals and an open region;
    attaching a coverlay layer directly on the base array;
    placing a component in the open region and directly on the coverlay layer;
    forming an encapsulation over the base array and the component;
    removing the coverlay layer to leave a plane of the terminals and a plane of the component partially exposed from and substantially coplanar with the encapsulation; and
    removing a portion of the base array between the terminals to form an encapsulation step in the encapsulation adjacent the component and a recessed surface extending from the encapsulation step to an outer vertical side of the encapsulation, the terminals protruding from the recessed surface.

2. The method as claimed in claim 1 wherein providing the terminals includes forming the terminals in an array with multiple rows.

3. The method as claimed in claim 1 wherein placing the component includes placing a package in the open region and directly on the coverlay layer.

4. The method as claimed in claim 1 wherein placing the component includes placing a package in the open region and directly on the coverlay layer, the package having a paddle and a pad partially exposed from the encapsulation.

5. The method as claimed in claim 1 wherein placing the component includes placing a heatsink in the open region and directly on the coverlay layer.

6. A method of manufacture of an integrated circuit packaging system comprising:
    providing a base array having terminals and an open region;
    attaching a coverlay layer directly on the base array;
    placing a component in the open region and directly on the coverlay layer;
    mounting a stack component over the component;
    forming an encapsulation over the base array, the component, and the stack component;
    removing the coverlay layer to leave a plane of the terminals and a plane of the component partially exposed from and substantially coplanar with the encapsulation; and
    removing a portion of the base array between the terminals to form an encapsulation step in the encapsulation adjacent the component and a recessed surface extending from the encapsulation step to an outer vertical side of the encapsulation, the terminals protruding from the recessed surface.

7. The method as claimed in claim 6 wherein providing the terminals includes forming the terminals in an array with multiple staggered rows.

8. The method as claimed in claim 6 wherein placing the component includes placing a multi-row quad flat no-lead package in the open region and directly on the coverlay layer.

9. The method as claimed in claim 6 wherein placing the component includes placing a package in the open region and directly on the coverlay layer, the package having a paddle and a pad with a planar surface substantially coplanar with that of the encapsulation.

10. The method as claimed in claim 6 wherein placing the component includes placing a heatsink in the open region and directly on the coverlay layer, the heatsink having an interlocking mechanism.

11. An integrated circuit packaging system comprising:
a base array having terminals and an open region;
a component in the open region, a plane of the terminals and a plane of the component substantially coplanar; and
an encapsulation, having an encapsulation step adjacent the component and a recessed surface extending from the encapsulation step to an outer vertical side of the encapsulation, over the base array and the component, the terminals protruding from the recessed surface.

12. The system as claimed in claim 11 wherein the terminals includes the terminals in an array with multiple rows.

13. The system as claimed in claim 11 wherein the component includes a package in the open region.

14. The system as claimed in claim 11 wherein the component includes a package in the open region, the package having a paddle and a pad partially exposed from the encapsulation.

15. The system as claimed in claim 11 wherein the component includes a heatsink in the open region.

16. The system as claimed in claim 11 further comprising a stack component over the component and covered by the encapsulation.

17. The system as claimed in claim 16 wherein the terminals includes the terminals in an array with multiple staggered rows.

18. The system as claimed in claim 16 wherein the component includes a multi-row quad flat no-lead package in the open region.

19. The system as claimed in claim 16 wherein the component includes a package in the open region, the package having a paddle and a pad along a surface of the component substantially coplanar with a planar surface of the encapsulation.

20. The system as claimed in claim 16 wherein the component includes a heatsink in the open region, the heatsink having an interlocking mechanism.

* * * * *